United States Patent
Lee et al.

(10) Patent No.: US 7,911,136 B2
(45) Date of Patent: Mar. 22, 2011

(54) POLARIZER AND ORGANIC LIGHT EMITTING DISPLAY APPARATUS INCLUDING THE SAME

(75) Inventors: Joon-Gu Lee, Suwon-si (KR); Young-Woo Song, Suwon-si (KR); Kyu-Hwan Hwang, Suwon-si (KR); Jong-Seok Oh, Suwon-si (KR); Jae-Heung Ha, Suwon-si (KR); Chul-Woo Park, Suwon-si (KR); Jong-Hyuk Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 12/712,125

(22) Filed: Feb. 24, 2010

(65) Prior Publication Data

US 2010/0148664 A1   Jun. 17, 2010

Related U.S. Application Data

(62) Division of application No. 11/691,471, filed on Mar. 26, 2007, now abandoned.

(30) Foreign Application Priority Data

Oct. 24, 2006   (KR) ................. 10-2006-0103686

(51) Int. Cl.
    *H01J 1/62* (2006.01)
(52) U.S. Cl. ...................... 313/506; 359/486
(58) Field of Classification Search .......... 359/486; 349/96; 313/110–112, 502–509
    See application file for complete search history.

(56) References Cited

U.S. PATENT DOCUMENTS

| | | |
|---|---|---|
| 5,177,635 A | 1/1993 | Keilmann |
| 6,288,840 B1 | 9/2001 | Perkins et al. |
| 2005/0088084 A1* | 4/2005 | Cok ........................ 313/506 |
| 2005/0128587 A1 | 6/2005 | Suganuma |
| 2006/0087602 A1 | 4/2006 | Kunisada et al. |
| 2007/0217008 A1 | 9/2007 | Wang et al. |
| 2007/0242352 A1 | 10/2007 | MacMaster |

* cited by examiner

*Primary Examiner* — Joseph L Williams
*Assistant Examiner* — Brenitra M Lee
(74) *Attorney, Agent, or Firm* — Christie, Parker & Hale, LLP

(57) ABSTRACT

A polarizer and an organic light emitting display apparatus including the polarizer. According to an embodiment of the present invention, a polarizer includes a substrate and a plurality of electrode units separated from each other on the substrate and formed in a stripe pattern. Each of the electrode units includes a first surface facing the substrate and a second surface opposite the first surface, the first surface having a width smaller than a width of the second surface.

13 Claims, 13 Drawing Sheets

EXTERNAL LIGHT

EXTERNAL LIGHT

EXTERNAL LIGHT

EXTERNAL LIGHT

EXTERNAL LIGHT

POLARIZER AND ORGANIC LIGHT EMITTING DISPLAY APPARATUS INCLUDING THE SAME

CROSS-REFERENCE TO RELATED PATENT APPLICATION

This application is a divisional of U.S. patent application Ser. No. 11/691,471, filed Mar. 26, 2007, which claims priority to and the benefit of Korean Patent Application No. 10-2006-0103686, filed on Oct. 24, 2006, in the Korean Intellectual Property Office, the entire contents of both of which are incorporated herein by reference.

BACKGROUND

1. Field of the Invention

The present invention relates to a polarizer and an organic light emitting display apparatus including the same.

2. Description of the Related Art

Among flat panel display apparatuses, organic or inorganic display apparatuses are emissive display apparatuses that receive attention as the next generation of display apparatuses due to their wide viewing angles, high contrast, and high response speeds. Also, organic light emitting display apparatuses in which a light emitting layer is formed of an organic material have higher brightness, lower driving voltage, and higher response speed than inorganic light emitting display apparatuses, and can provide multicolored images.

Flat panel display apparatuses are manufactured to be lightweight and slim so that they can be used outdoors. When an image is viewed outdoors, contrast and visibility of the image is reduced due to reflection of external light. In particular, in an organic light emitting display apparatus, the amount of reflection may be great because of a metal reflection film.

SUMMARY

Aspects of the present invention respectively provide a polarizer for increasing contrast and visibility of a corresponding display apparatus and a light emitting display apparatus having the polarizer.

According to an embodiment of the present invention, a polarizer includes a substrate and a plurality of electrode units separated from each other on the substrate and formed in a stripe pattern. Each of the electrode units includes a first surface facing the substrate and a second surface opposite the first surface, the first surface having a width smaller than a width of the second surface.

The electrode units may include at least one of aluminum, silver, or chromium, and the polarizer may further include a blackened layer on surfaces of each of the electrode units for absorbing external light.

According to another embodiment of the present invention, a method of forming a polarizer includes: forming a plurality of electrode units separated from each other in a stripe pattern on a substrate; and blackening surfaces of the electrode units using a chemical process. Each of the electrode units includes a first surface facing the substrate and a second surface opposite the first surface, the first surface having a width smaller than a width of the second surface.

The blackening surfaces of the electrode units may include: removing oxides from the surfaces of the electrode units; and processing the surfaces of the electrode units using a solution including nitric acid, potassium permanganate, and copper nitrate.

According to another embodiment of the present invention, an organic light emitting display apparatus includes: a substrate; an organic light emitting device formed on the substrate and adapted to display an image; a sealing member formed on the organic light emitting device; a quarter-wave layer formed on one of the substrate, the organic light emitting device, or the sealing member; and a linear polarizing layer formed on one of the substrate, the organic light emitting device, the sealing member, or the quarter-wave layer. A distance between the linear polarizing layer and a location at which the image is displayed is smaller than a distance between the quarter-wave layer and the location at which the image is displayed. The linear polarizing layer includes a plurality of electrode units, each of the electrode units having a first surface facing incoming external light and a second surface opposite the first surface, the first surface having a width smaller than a width of the second surface.

The image may be displayed towards the substrate, the quarter-wave layer may be formed on the linear polarizing layer, and the organic light emitting device may be formed on the quarter-wave layer.

The image may be displayed towards the substrate, the linear polarizing layer may be formed on the substrate, the quarter-wave layer may be formed on the linear polarizing layer, the linear polarizing layer may be formed on the substrate, and the organic light emitting device may be formed on the quarter-wave layer.

The image may be displayed towards the substrate, the quarter-wave layer may be formed on a first surface of the substrate, the organic light emitting device may be formed on the quarter-wave layer, and the linear polarizing layer may be formed on a second surface of the substrate, the second surface of the substrate being opposite the first surface of the substrate.

The image may be displayed towards the substrate, the organic light emitting device may be formed at a first surface of the substrate, and the quarter-wave layer and the linear polarizing layer may be sequentially formed on a second surface of the substrate, the second surface of the substrate being opposite the first surface of the substrate.

The image may be displayed towards the sealing member, the quarter-wave layer may be formed on the organic light emitting device, and the linear polarizing layer may be formed on the quarter-wave layer.

The organic light emitting display apparatus may further include a passivation film formed between the organic light emitting device and the quarter-wave layer.

The image may be displayed towards the sealing member, the quarter-wave layer and the linear polarizing layer may be sequentially formed on a surface of the sealing member opposite a surface of the sealing member on which the organic light emitting device is formed.

The image may be displayed towards the sealing member, the quarter-wave layer may be formed on a surface of the sealing member facing the organic light emitting device, and the linear polarizing layer may be formed on a surface of the sealing member opposite a surface of the sealing member on which the quarter-wave layer is formed.

The image may be displayed towards the sealing member, the linear polarizing layer may be formed on a surface of the sealing member facing the organic light emitting device, and the quarter-wave layer may be formed on a surface of the linear polarizing layer facing the organic light emitting device.

The organic light emitting display apparatus may further include a reflection film interposed between the substrate and the organic light emitting device. The image may be displayed towards the sealing member, the quarter-wave layer may be formed between the reflection film and the organic light emitting device, and the linear polarizing layer may be formed on the organic light emitting device.

BRIEF DESCRIPTION OF THE DRAWINGS

The above and other features and aspects of the present invention will become more apparent by describing in more detail exemplary embodiments thereof with reference to the attached drawings in which.

DETAILED DESCRIPTION

The present invention will now be described more fully with reference to the accompanying drawings in which exemplary embodiments of the invention are shown.

In one exemplary embodiment according to the present invention, a circular polarizer is provided on a surface of a flat panel display apparatus (e.g., an organic light emitting display apparatus). The circular polarizer includes a linear polarizing plate formed as a wire electrode by forming a linear pattern using a thin metal. In such an arrangement, the wire electrode formed of a material that includes a metal reduces contrast and brightness of the flat panel display apparatus by reflecting external light or light generated in the flat panel display apparatus due to the material used to form the wire electrode.

Figure 1:
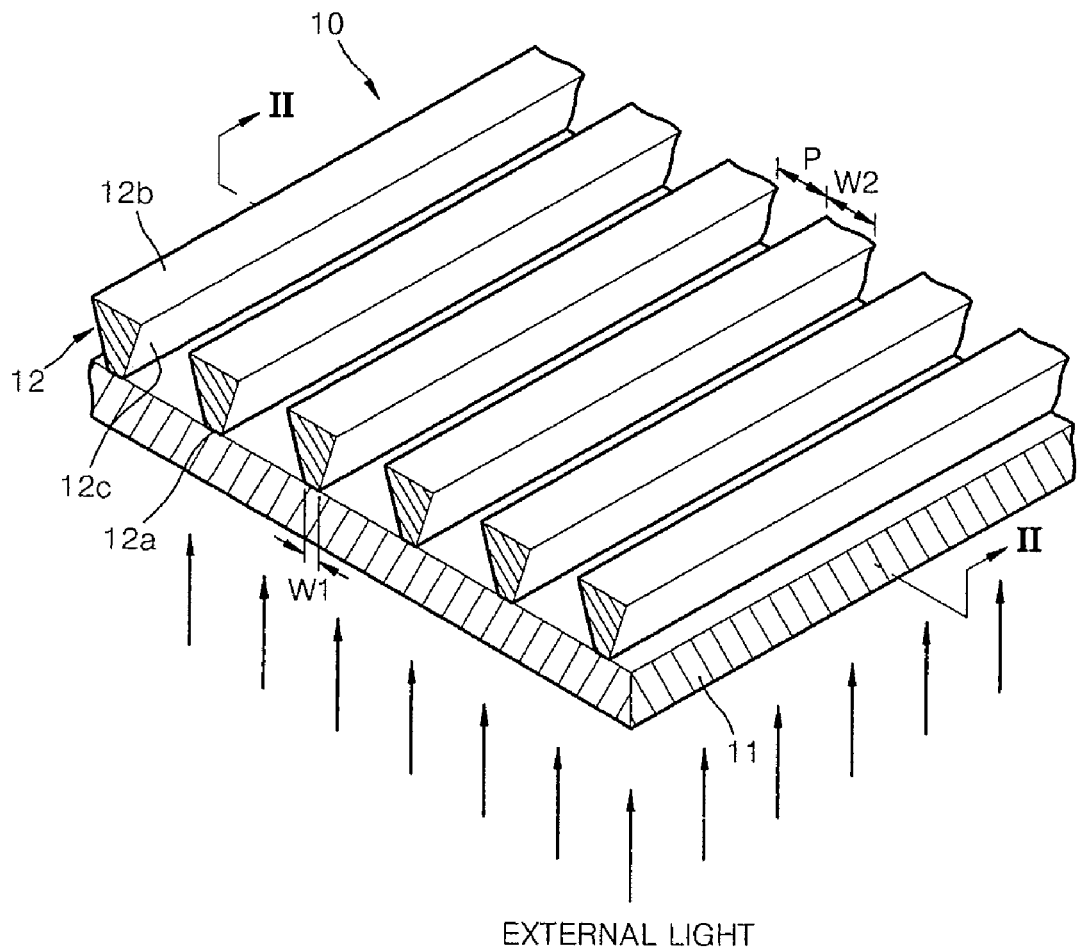
FIG. 1 is a schematic perspective view illustrating a polarizer according to an embodiment of the present invention.
Figure 2:
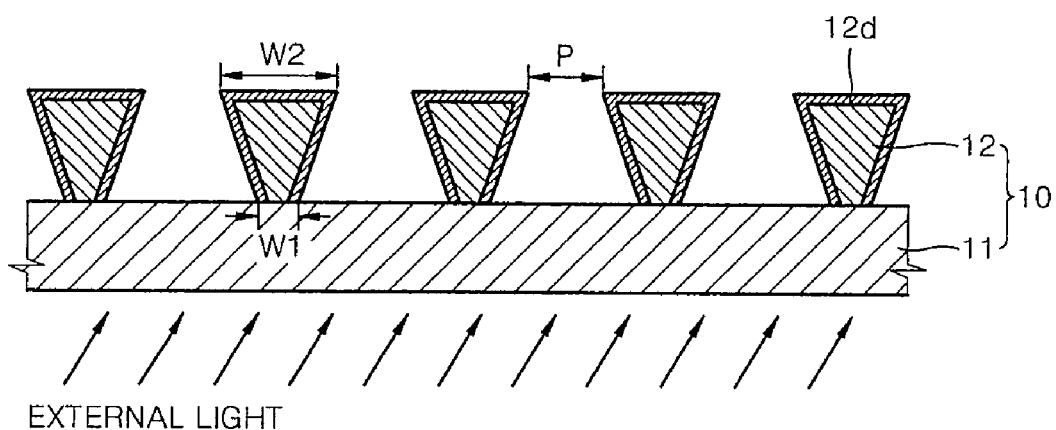
FIG. 2 is a cross-sectional view taken along line II-II of FIG. 1.

FIG. 1 is a schematic perspective view illustrating a polarizer 10 according to an embodiment of the present invention, and FIG. 2 is a cross-sectional view taken along line II-II of FIG. 1.

Referring to FIGS. 1 and 2, the polarizer 10 includes a substrate 11 and a plurality of electrode units 12.

The substrate 11, in one embodiment, can be formed of a transparent material such that light generated from a display apparatus, on which the polarizer 10 is disposed, can be transmitted thereby. By way of example, the substrate 11 can be formed of glass or flexible plastic. In one embodiment, the substrate 11 is formed of a material that includes a plastic film.

The plurality of electrode units 12 are formed on the substrate 11. The electrode units 12, in one embodiment, are formed to polarize light waves of a certain wavelength (or wavelengths) and can be formed of a conductive material such as aluminium, silver, chromium, or an alloy of two or more of these metals in a stripe pattern in which conductive lines are separated from each other and run parallel to each other.

The plurality of electrode units 12 are separated at a distance P (which may be predetermined) from each other. The distance P is a factor for determining the performance of the polarizer 10. In one embodiment, if the distance P between the electrode units 12 is greater than the wavelengths of incident light, the polarizer 10 may perform mainly as a diffraction grid instead of a polarizer. In contrast, in the described embodiment, if the distance P between the electrode units 12 is smaller than the wavelengths of the incident light, the polarizer 10 may mainly perform as a polarizer.

Each of the plurality of electrode units 12 includes a first surface 12a having a first width w1 and facing the substrate 11 and a second surface 12b that is the surface of the electrode unit 12 that is opposite the first surface 12a and that has a second width w2 which is greater than the first width w1. As shown in FIGS. 1 and 2, external light, which may include light from any external light source, is incident on and enters through a bottom surface of the substrate 11. Here, the area of the surface at which the external light is reflected is relatively reduced since the first width w1 of the first surface 12a (which faces the incoming external light) is smaller than the second width w2 of the second surface 12b of the electrode unit 12. Accordingly, the amount of external light reflected by the metal of the electrode units 12 is reduced. To increase (or maximize) this effect, as depicted in FIG. 2, the shape of the electrode units 12 can be formed to have an inversed triangular structure by reducing the width of the electrode units 12 from the second width w2 down to the first width w1 of the first surface 12a towards the entry of the external light. The inversed triangular structure can be formed by using a mask to pattern a conductive material for forming the electrode units 12 after the conductive material is coated on the substrate 11. In one embodiment, when patterning the conductive material using a mask, the conductive material can be etched to have an inversed tapered shape by controlling the concentration of an etching solution and etching speed. Alternatively, the same shape can be obtained by controlling a dry etching speed.

In one embodiment, the entire surface of the electrode units 12 including side surfaces 12c of the electrode units 12 can be blackened. External light can be reflected at the side surfaces 12c of the electrode units 12 due to a tapered structure of the electrode units 12. Here, the reflection of the external light can be reduced (or minimized) by blackening side surfaces 12c of the electrode units 12.

In order to blacken the side surfaces 12c of the electrode units 12, in one embodiment, a metal oxide film formed on the surfaces of the electrode units 12 is removed using a mechanical method or an acid. Here, various acids can be used to remove the metal oxide film by controlling the concentration of the acids according to the material the electrode units 12 are formed of. The acids can be a chrome acid solution or a mixed solution made by mixing chrome acid and phosphoric acid. The electrode units 12 are processed with a chemical solution after the metal oxide film is removed. The chemical solution can be a mixed solution made of water, nitric acid, copper nitrate, and potassium permanganate, for example, a mixed solution that includes 1 L of water, 5 ml of nitric acid, 25 g of copper nitrate, and 10 g of potassium permanganate. A blackened layer 12d (see, for example, FIG. 2) is formed on the entire surface of the electrode unit 12 including the side surfaces 12c of the electrode unit 12 by the blackening process using a chemical solution as described above.

The polarizer 10 according to the described embodiments of the present invention can be used for a variety of flat panel display apparatuses such as an organic light emitting display apparatus. For illustrative purposes only, embodiments used for an organic light emitting display apparatus will be described below. The organic light emitting display apparatus according to an embodiment of the present invention does not require an additional substrate 11 for the polarizer 10. Rather, in one embodiment, a linear polarizing layer including a plurality of electrode units 12 is directly formed on a substrate of the organic light emitting display apparatus, and a sealing member is included in the organic light emitting display apparatus. The electrode units 12 of the linear polarizing layer which will be described later are substantially identical to the electrode units 12 in the polarizer 10 according to embodiments described above, and, thus, a more detailed description of the structure, material(s), and manufacturing method thereof will not be provided below. In one embodiment, blackened layers 12d can be formed on the electrode units 12 in substantially the same manner as in previously described embodiments of the polarizer 10, and, thus, a more detailed description thereof will also not be provided below.

Figure 3:
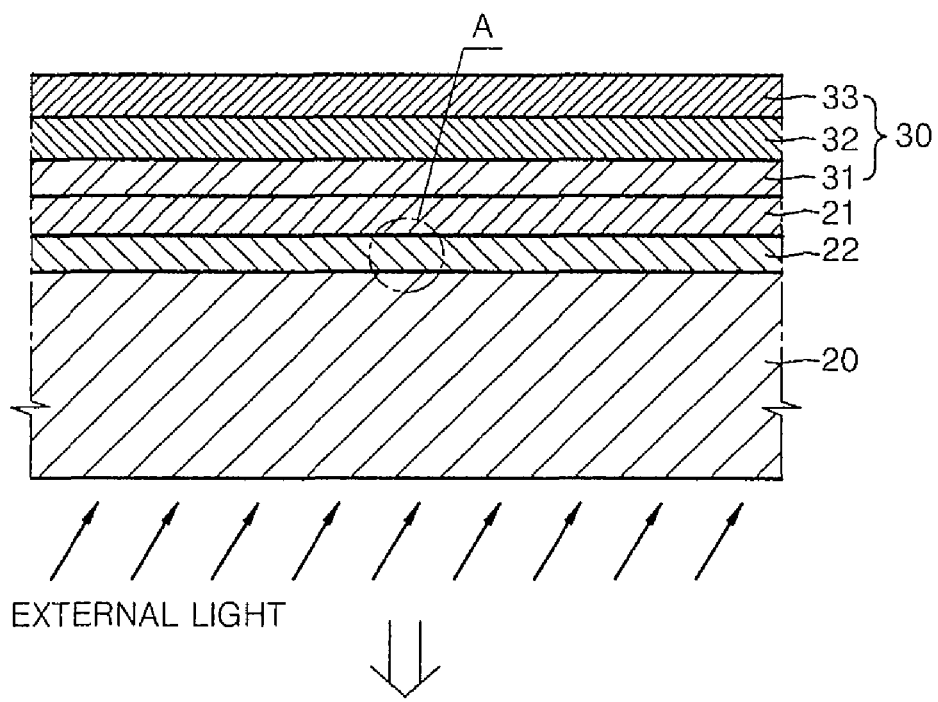
FIGS. 3, 4, 5, 6, 7 and 8 are schematic cross-sectional views illustrating bottom emission type organic light emitting display apparatuses and enlarged views of linear polarizing layers thereof, according to embodiments of the present invention.

FIG. 3 is a schematic cross-sectional view illustrating an organic light emitting display apparatus according to an embodiment of the present invention. As shown in FIG. 3, the organic light emitting display apparatus includes a linear polarizing layer 22, a quarter-wave layer 21, an organic light emitting device 30, and a sealing member sequentially formed on a substrate 20 which is formed of a transparent material.

In one embodiment, the substrate 20 can be formed of a transparent glass material including $SiO_2$ as a main component. In one embodiment, a buffer layer can further be included on an upper surface of the transparent substrate 20 to improve a planarity of the substrate 20 and to block the penetration of impure elements. In one embodiment, the buffer layer can be formed of $SiO_2$ and/or $SiNx$. However, the substrate 20 according to embodiments of the present invention is not limited thereto, and, by way of example, can be formed of a transparent plastic material.

Figure 4:
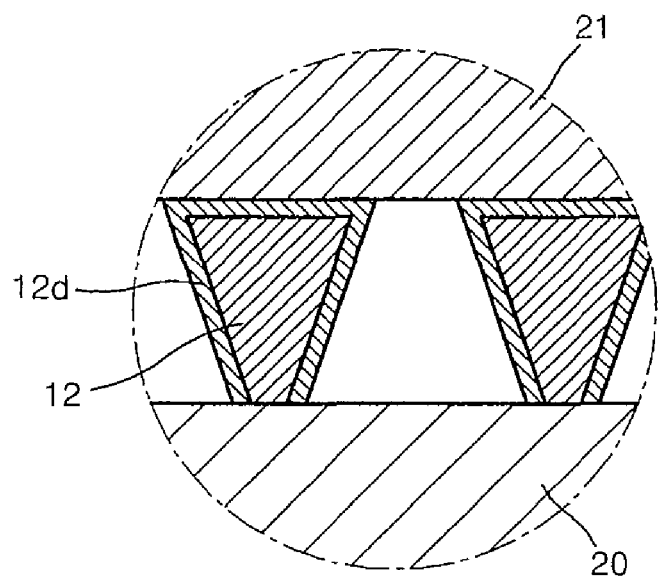

The linear polarizing layer 22 is formed on the substrate 20. FIG. 4 is an enlarged view of portion A of the linear polarizing layer 22 shown in FIG. 3. The linear polarizing layer 22 includes a plurality of electrode units 12. FIGS. 3 and 4 illustrate a bottom emission type organic light emitting display apparatus, and, thus, external light that is incident on the bottom emission type organic light emitting display apparatus may enter through a bottom surface of the substrate 20. As such, each of the electrode units 12 has a tapered structure in which a surface of the electrode unit 12 facing the substrate 20 has a width smaller than that of the opposite surface of the electrode unit 12 facing the quarter-wave layer 21. The methods of manufacturing the electrode units 12 are substantially identical to the methods described earlier with reference to FIGS. 1 and 2, and, thus, a more detailed description thereof will not be provided below.

In one embodiment, the quarter-wave layer 21 is formed on the linear polarizing layer 22 by obliquely depositing an inorganic material. Here, minute columns extend from a surface of the linear polarizing layer 22 in an oblique direction. The oblique direction of the columns corresponds to a crystal growing direction. When an inorganic material is deposited, the inorganic material grows in a cylindrical shape. Accordingly, in an oblique deposition, the cylindrical shape inclines at an angle (which may be predetermined) with respect to a horizontal direction, e.g., a direction along which the substrate 20 extends. As a result, a birefringence characteristic can be provided to the quarter-wave layer 21.

In one embodiment, the quarter-wave layer 21 can be formed of various inorganic materials such as $TiO_2$ or $TaOx$, and, in another embodiment, when the quarter-wave layer 21 is formed of CaO or BaO, a moisture absorbing function can be provided to the quarter-wave layer 21.

The organic light emitting device 30 is formed on the quarter-wave layer 21. In regard to the stacking sequence of the quarter-wave layer 21 and the linear polarizing layer 22, the linear polarizing layer 22 is disposed closer to the entry of the external light, and the quarter-wave layer 21 is disposed on an inner side of the linear polarizing layer 22. In one embodiment, another light transmitting member can be interposed between the quarter-wave layer 21 and the linear polarizing layer 22.

The organic light emitting device 30 includes a first electrode 31, a second electrode 33 facing the first electrode 31, and an organic light emitting layer 32 interposed between the first and second electrodes 31 and 33. In one embodiment, the first electrode 31 can be formed of a transparent conductive material, such as indium tin oxide (ITO), indium zinc oxide (IZO), $In_2O_3$, and/or ZnO, in a pattern (which may be a predetermined pattern) using a photolithography method. In one embodiment, in a passive matrix (PM) type organic light emitting device, the pattern of the first electrode 31 can include stripe shaped lines separated by a distance (which may be predetermined) from each other, and, in another embodiment, in an active matrix (AM) type organic light emitting device, the first electrode 31 can be formed to have a shape corresponding to pixels of the device. The second electrode 33 is disposed above the first electrode 31. In one embodiment, the second electrode 33 can include a reflective electrode formed of aluminium, silver and/or calcium, and can act as a cathode electrode by being connected to an external terminal. In a PM type organic light emitting device, the second electrode 33 can have a stripe shape crossing the first electrode 31, and in an AM type organic light emitting device, the second electrode 33 can be formed on the entire active region on which an image is displayed. The polarities of the first electrode 31 and the second electrode 33 are not limited thereto and may be reversed.

The organic light emitting layer 32 interposed between the first electrode 31 and the second electrode 33 emits light by electrically driving the first electrode 31 and the second electrode 33. In one embodiment, the organic light emitting layer 32 can be formed of a low molecular organic material or a polymer organic material. In one embodiment, when the organic light emitting layer 32 is formed of a low molecular organic material, a hole transport layer (HTL) and a hole injection layer (HIL) are further stacked between the first electrode 31 and the organic light emitting layer 32, and an electron transport layer (ETL) and an electron injection layer (EIL) are further stacked between the second electrode 33 and the organic light emitting layer 32. In addition to (or other than) the above mentioned layers, other various layers can be stacked as necessary. The low molecular organic material can be one of copper phthalocyanine (CuPc), N,N'-Di(naphthalene-1-yl)-N,N'-diphenyl-benzidine (NPB), tris-8-hydroxyquinoline aluminum)(Alq3), or the like.

In the described embodiment, when the organic light emitting layer 32 is formed of a polymer organic material, only a hole transport layer (HTL) can be included between the first electrode 31 and the organic light emitting layer 32. The HTL is formed on the first electrode 31 and can be formed of poly-(2,4)-ethylene-dihydroxy thiophene (PEDOT) and/or polyaniline (PANI) using inkjet printing and/or spin coating. The organic light emitting layer 32 can be formed according to a colored pattern using poly-phenylenevinylene (PPV), soluble PPV's, Cyano-PPV's, and/or polyfluorene by a conventional method such as inkjet printing, spin coating, and/or thermal transferring using a laser.

Light generated from the organic light emitting device 30 according to the embodiment depicted in FIG. 3 is emitted through the substrate 20. Thus, an image is viewed at a bottom surface of the substrate 20 in FIG. 3. In the bottom type organic light emitting device, contrast can be reduced due to external light, e.g., sun light, incident on the substrate 20.

However, according to an embodiment of the present invention, the reflection of external light can be reduced (or minimized) since the linear polarizing layer 22 and the quarter-wave layer 21 form a circular polarizing layer. Of the external light entering from (or at) a bottom surface of the substrate 20, a component corresponding to an absorption axis of the linear polarizing layer 22 is absorbed by the linear polarizing layer 22, and a component corresponding to a transmitting axis thereof is transmitted by the linear polarizing layer 22. The component of the external light corresponding to the transmitting axis of the linear polarizing layer 22 is transformed to circularly polarized light that rotates in a first direction as a result of passing through the quarter-wave layer 21. The circularly polarized light is reflected by the second electrode 33 of the organic light emitting device 30. When the circularly polarized light is reflected by the second electrode 33, the circularly polarized light that rotates in the first direction becomes a circularly polarized light that rotates in a second direction, and the circularly polarized light that rotates in the second direction is transformed to linearly polarized light polarized in a direction crossing the transmitting axis, i.e. a direction corresponding to the absorption axis of the linear polarizing layer 22. As such, the linearly polarized light cannot be transmitted through the bottom surface of the substrate 20 since the linearly polarized light, which is polarized in the direction of the absorption axis of the linear polarizing layer 22, is thus absorbed by the linear polarizing layer 22. Accordingly, the reflection of the external light is reduced (or minimized), and hence, contrast of the organic light emitting display apparatus can be further improved.

The linear polarizing layer 22 according to an embodiment of the present invention includes the plurality of electrode units 12. The electrode units 12 have a smaller reflection surface with reference to the external light since, in each of the electrode units 12, a surface that faces the incoming external light has a width smaller than that of the opposite surface of the electrode unit 12. When the external light incident to the substrate 20 reaches the linear polarizing layer 22, the reflection of the external light is reduced (or minimized) by (or at) the electrode units 12 formed of a metal, thereby increasing contrast of the organic light emitting display apparatus.

In one embodiment, surfaces of the electrode units 12 can be blackened. Here, the contrast can be further increased since reflection by (or at) side surfaces of the electrode units 12 can be reduced.

The organic light emitting display apparatus according to an embodiment of the present invention has a structure that does not require an adhesive layer since the quarter-wave layer 21 and the linear polarizing layer 22 are directly formed on the substrate. Therefore, an organic light emitting display apparatus having a reduced thickness can be realized. Also, the organic light emitting display apparatus according to an embodiment of the present invention can have an increased brightness since an image realized from the light emitting layer does not need to be transmitted through an adhesive layer.

The linear polarizing layer 22 and the quarter-wave layer 21 can be formed in any of various suitable ways. As will be described in more detail below, the structure of the linear polarizing layer 22 and the quarter-wave layer 21 can also be applied to a top emission type organic light emitting device as well as the bottom emission type organic light emitting device described above by making appropriate modifications in consideration of the incident direction of the external light.

Figure 5:
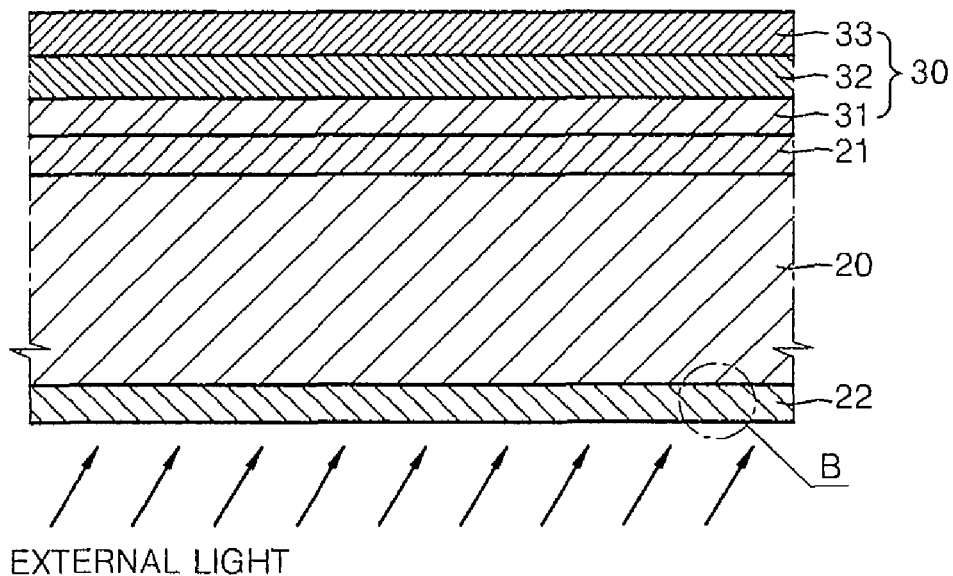
Figure 6:
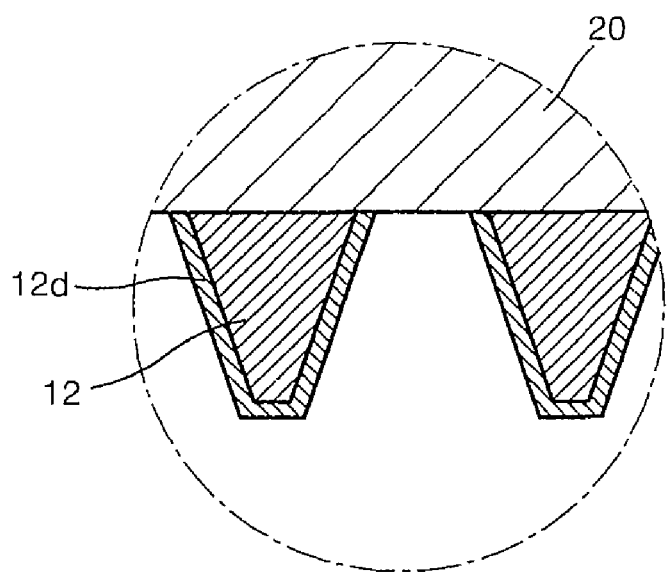

FIG. 5 is a schematic cross-sectional view illustrating another example of a bottom emission type organic light emitting display apparatus according to an embodiment of the present invention. A linear polarizing layer 22 is formed on a surface of a substrate 20 facing outside (e.g., facing the incoming external light), and a quarter-wave layer 21 is formed on the opposite surface of the substrate 20. An organic light emitting device 30 is formed on the quarter-wave layer 21. An enlarged view of portion B of FIG. 5, that is, a more detailed structure of the linear polarizing layer 22, is shown in FIG. 6. The linear polarizing layer 22 includes a plurality of electrode units 12. In each of the electrode units 12, a surface that does not face the substrate 20 but rather faces the incoming external light has a width smaller than the opposite surface of the electrode unit 12. A more detailed description of each of the electrode units 12 will not be provided below since these elements are substantially identical to those of previously described embodiments. In the present embodiment, external light entering through the substrate 20 is linearly polarized into linearly polarized light having a polarization direction parallel to a transmitting axis of the linear polarizing layer 22 as a result of passing through the linear polarizing layer 22. The linearly polarized light is transformed to a circularly polarized light that rotates in a first direction as a result of passing through the quarter-wave layer 21 via the substrate 20, and is transformed to a circularly polarized light rotating in a second direction as a result of being reflected by a second electrode 33. The circularly polarized light rotating in the second direction is transformed to a linearly polarized light having a polarization direction crossing the transmitting axis of the linear polarizing layer 22 as a result of passing through the quarter-wave layer 21, and thus, the linearly polarized light cannot pass through the linear polarizing layer 22. Therefore, external light which has entered the organic light emitting display apparatus and is reflected therein cannot be transmitted back out and thus is not viewed at a bottom surface of the substrate 20, that is, the reflection of the external light is reduced, thereby increasing contrast of the organic light emitting display apparatus.

Furthermore, as described above, the linear polarizing layer 22 includes the plurality of electrode units 12, and, in each of the electrode units 12, a surface that faces the incoming external light has a width smaller than that of the opposite surface of the electrode unit 12 such that a surface area at which the external light can be reflected is reduced. As a result, contrast is increased due to the reduction of the reflection of the external light. In one embodiment, the reflection of the external light can further be reduced by blackening the electrode units 12.

Figure 7:
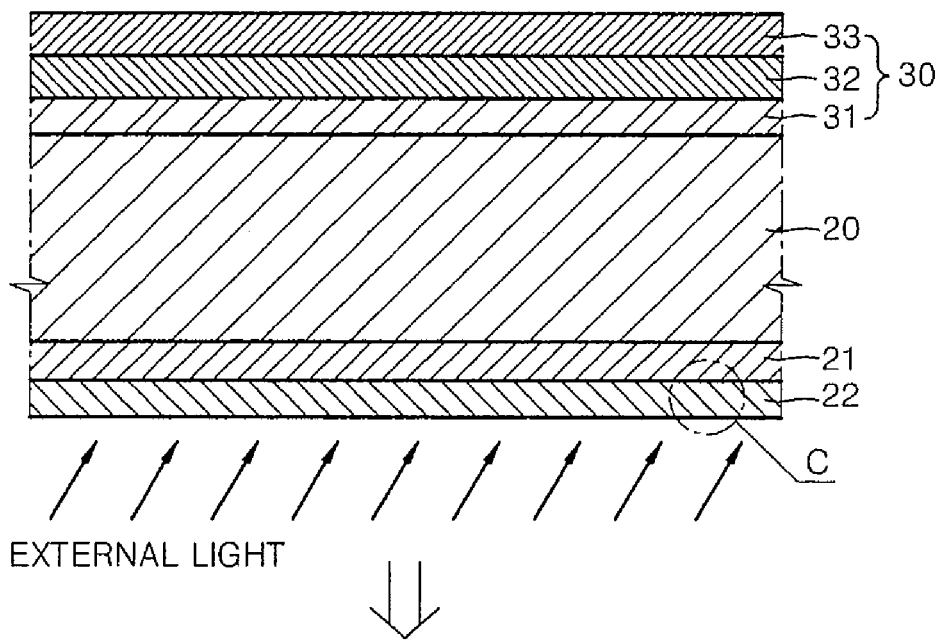

FIG. 7 is a schematic cross-sectional view illustrating another example of bottom emission type organic light emitting display apparatus according to an embodiment of the present invention. A quarter-wave layer 21 and a linear polarizing layer 22 are sequentially formed on a surface of a substrate 20 that faces outside, i.e. that faces the incoming external light, and an organic light emitting device 30 is formed on the opposite surface of the substrate 20. Each of the elements are substantially the same as corresponding elements of previously described embodiments, and, thus, more detailed descriptions thereof will not be provided below.

Figure 8:
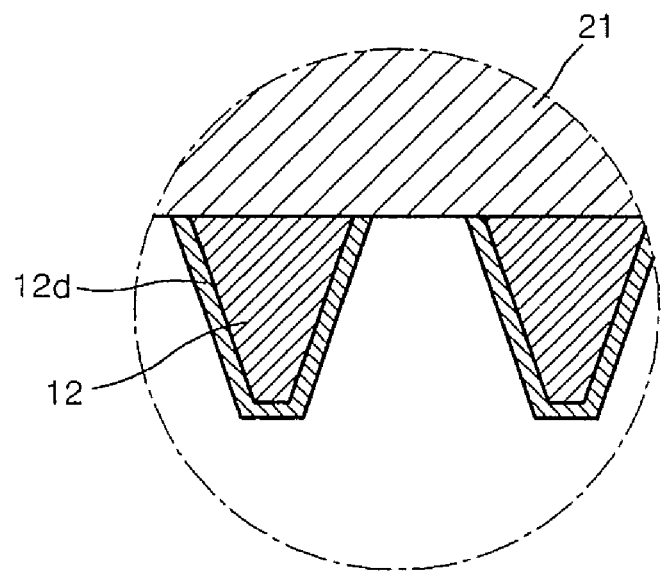

An enlarged view of portion C of FIG. 7, that is, a more detailed structure of the linear polarizing layer 22, is shown in FIG. 8. The linear polarizing layer 22 includes a plurality of electrode units 12. The electrode units 12 are formed under a quarter-wave layer 21. In each of the electrode units 12, a surface that faces the quarter-wave layer 21 has a width greater than that the opposite surface of the electrode unit 12.

As in previously described embodiments, in each of the electrode units 12, a surface that faces the incoming external light has a width smaller than that of the opposite surface of the electrode unit 12 such that areas of surfaces that reflect the external light are reduced, thereby increasing contrast.

Up until now, a bottom emission type organic light emitting display apparatus in which an image is displayed at a substrate 20 (i.e., at a bottom surface of the display apparatus) has been described. However, the present invention is not limited thereto, and embodiments of the present invention can also be applied to a top emission type organic light emitting display apparatus in which an image realized from a light emitting layer is not displayed at the substrate 20, but is displayed at a surface of the display apparatus opposite the substrate 20.

Figure 9:
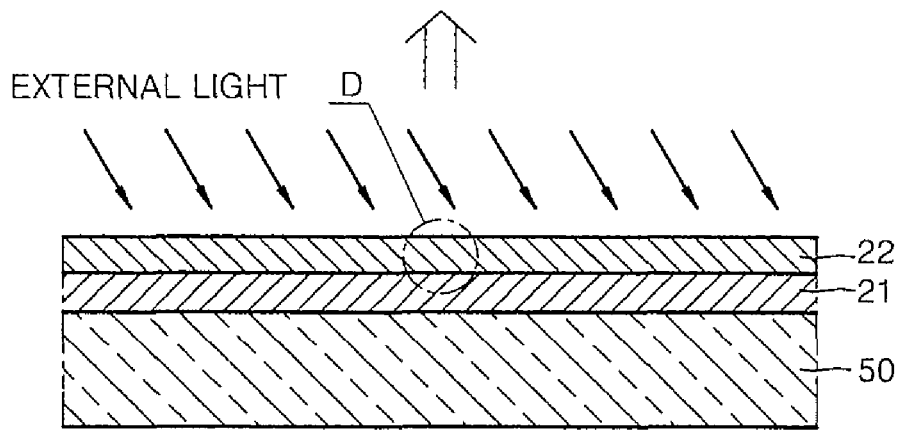
FIGS. 9, 10, 11, 12, 13, 14, 15, 16, 17 and 18 are schematic cross-sectional views illustrating top emission type organic light emitting display apparatuses and enlarged views of linear polarizing layers thereof, according to embodiments of the present invention.

FIG. 9 is a cross-sectional view illustrating a top emission type organic light emitting display apparatus according to an embodiment of the present invention. The organic light emitting display apparatus includes a substrate 20, a reflection film 34 on the substrate 20, an organic light emitting device 30, and a sealing member 50.

In one embodiment, the substrate 20 can be formed of a transparent glass as described previously, but does not necessarily need to be transparent. In one embodiment, the substrate 20 can be formed of a plastic or a metal to have a certain flexibility. Here, an insulating film can further be formed on a surface thereof if the substrate 20 is formed of metal.

The reflection film 34 formed on a surface of the substrate 20 can be formed of Ag, Mg, Al, Pt, Pd, Au, Ni, Nd, Ir, Cr, or a compound of two or more of these metals. A first electrode 31 can be formed on the reflection film 34 using a material having a high work function such as ITO, IZO, ZnO, and/or $In_2O_3$. Here, the first electrode 31 acts as an anode electrode. If the first electrode 31 is to act as a cathode electrode, the first electrode 31 can be formed of Ag, Mg, Al, Pt, Pd, Au, Ni, Nd, Ir, Cr, or a compound of two or more of these metals such that the first electrode 31 can also be used as the reflection film 34. Hereinafter, for purposes of illustration only, embodiments of the present invention will be described in more detail on the basis of using the first electrode 31 as an anode electrode.

In one embodiment, a second electrode 33 is a transparent electrode. The second electrode can be formed as a thin semi-permeable membrane using a metal having a low work function such as Li, Ca, LiF/Al, Al, Mg, Ag, or the like. The problem associated with a high resistance of the thin metal semi-permeable membrane can be solved by forming a transparent conductor using ITO, IZO, ZnO, and/or $In_2O_3$ on the metal semi-permeable membrane.

An organic light emitting layer 32 is formed between the first and second electrodes 31 and 33, and is substantially identical to the organic light emitting layer 32 in previously described embodiments.

The sealing member 50 for sealing the organic light emitting device 30 is formed on the organic light emitting device 30. The sealing member 50 is formed to prevent the organic light emitting device 30 from being exposed to external moisture or oxygen, and can be formed of a transparent material. Here, the sealing member 50 may include a glass substrate, a plastic substrate, or a layered structure of organic and inorganic materials.

Figure 10:
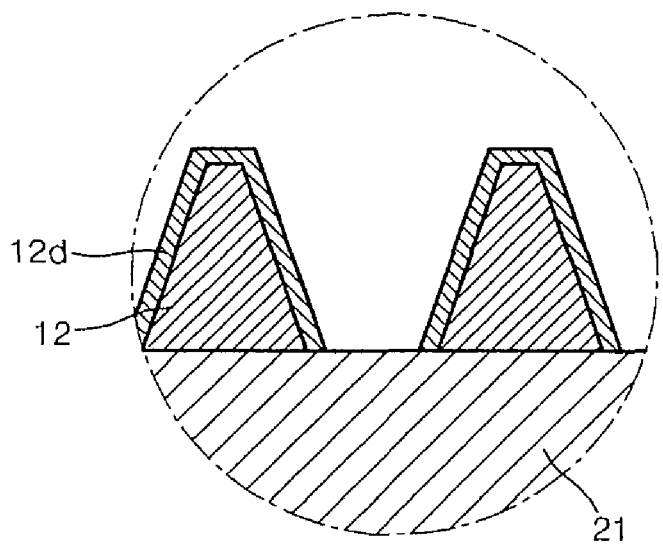

A quarter-wave layer 21 and a linear polarizing layer 22 are sequentially formed on an upper surface of the sealing member 50, that is, a surface that does not face the organic light emitting device 30 but rather faces away from the organic light emitting device 30. An enlarged view of portion D of FIG. 9, that is, a more detailed structure of the linear polarizing layer 22, is shown in FIG. 10. A plurality of electrode units 12 are formed on the quarter-wave layer 21. In each of the electrode units 12, a surface that faces the incoming external light has a width smaller than that of the opposite surface of the electrode unit 12. Referring to FIG. 10, the surface of the electrode unit 12 that faces the quarter-wave layer 21 is wider than the opposite surface of the electrode unit 12 that faces the incoming external light. According to the present embodiment, external light incident on a top surface of the organic light emitting display apparatus, that is, the external light entering from above the linear polarizing layer 22 in FIG. 9, is reflected by a surface of the reflection film 34 after sequentially passing through the linear polarizing layer 22 and the quarter-wave layer 21, but the external light reflected by the surface of the reflection film 34 cannot finally pass through the linear polarizing layer 22 due to reasons explained in previously described embodiments.

As shown in FIG. 10, in each of the electrode units 12, a surface that faces the incoming external light has a width smaller than that of the opposite surface to reduce an area of an external light reflection surface of the electrode unit 12 when the external light enters from above the linear polarizing layer 22. As a result, the reflection of the external light is reduced (or minimized), thereby increasing contrast of the organic light emitting display apparatus.

Also, in one embodiment, the reflection of the external light by side surfaces of the electrode units 12 can further be reduced by blackening the entire surface of the electrode units 12.

Figure 11:
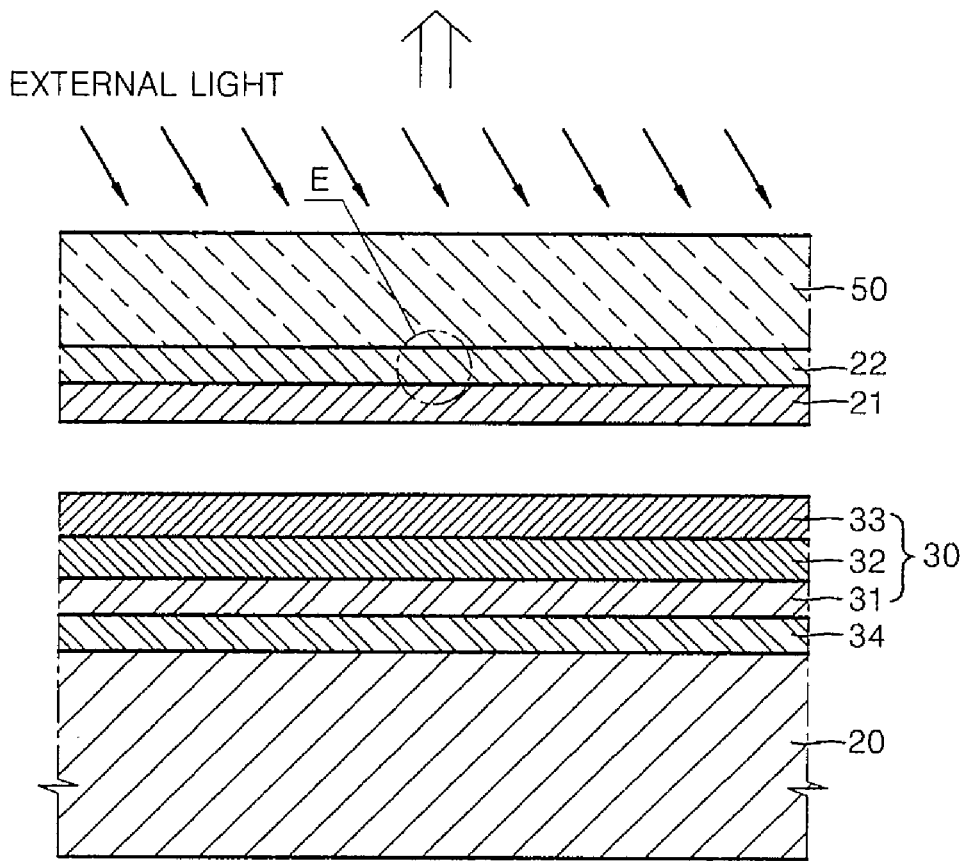
Figure 12:
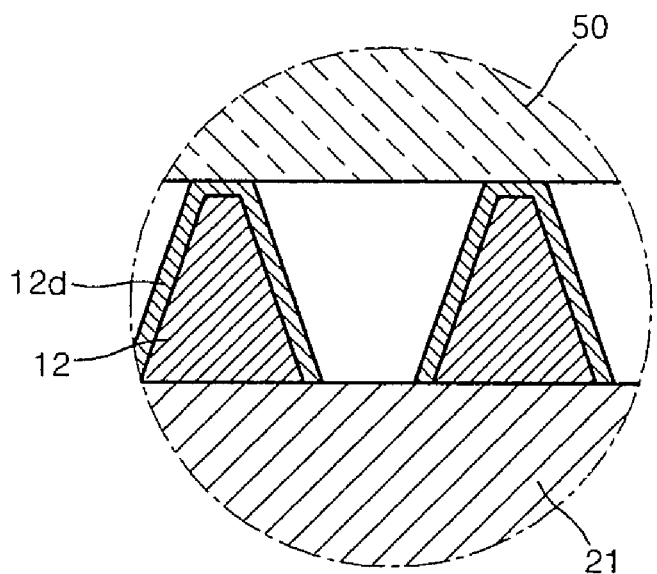

FIG. 11 is a schematic cross-sectional view of another example of a top emission type organic light emitting display apparatus according to another embodiment of the present invention. A linear polarizing layer 22 and a quarter-wave layer 21 are sequentially formed on a surface of the sealing member 50 that faces the organic light emitting device 30. An enlarged view of portion E of FIG. 11, that is, a more detailed structure of the linear polarizing layer 22, is shown in FIG. 12. A plurality of electrode units 12 are formed on a bottom surface of the sealing member 50. In each of the electrode units 12, a surface that faces the sealing member 50, that is, the surface that faces the incoming external light has a width smaller than that of the opposite surface that faces the quarter-wave layer 21. More detailed descriptions of the structure of the organic light emitting display apparatus and the effects of the structure will not be provided below since the structure, except the locations of the quarter-wave layer 21 and the linear polarizing layer 22, and the effect thereof are substantially identical to those described in a previous embodiment.

Figure 13:
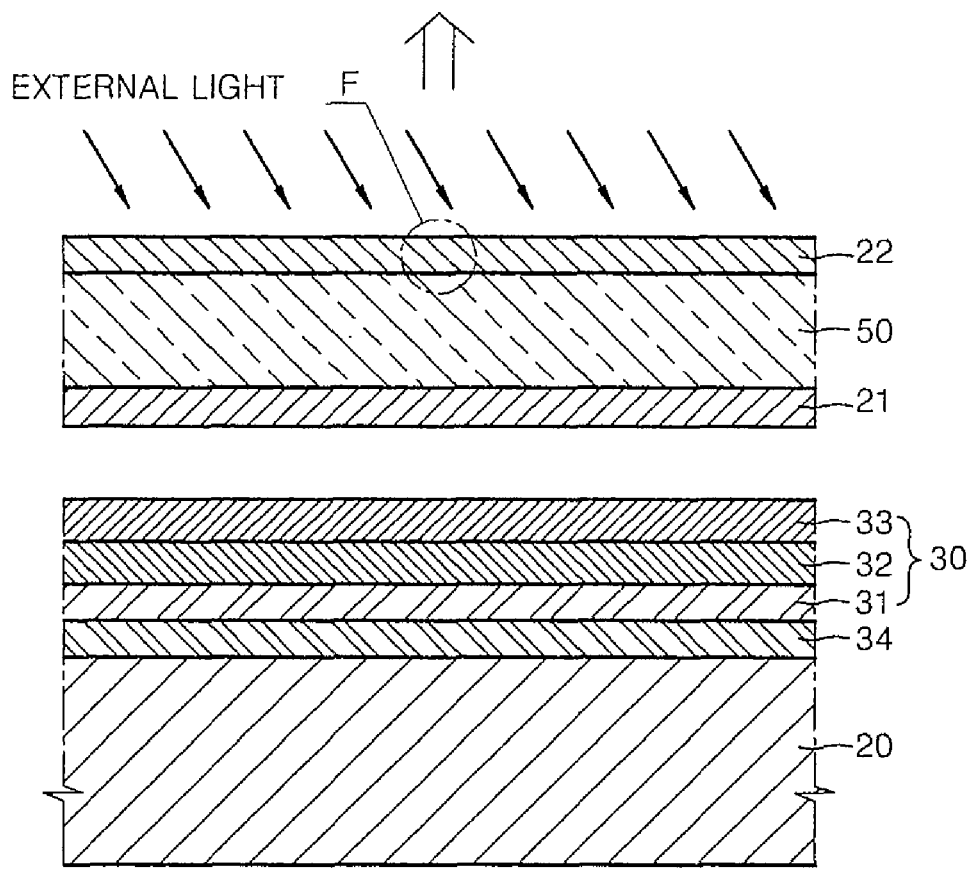
Figure 14:
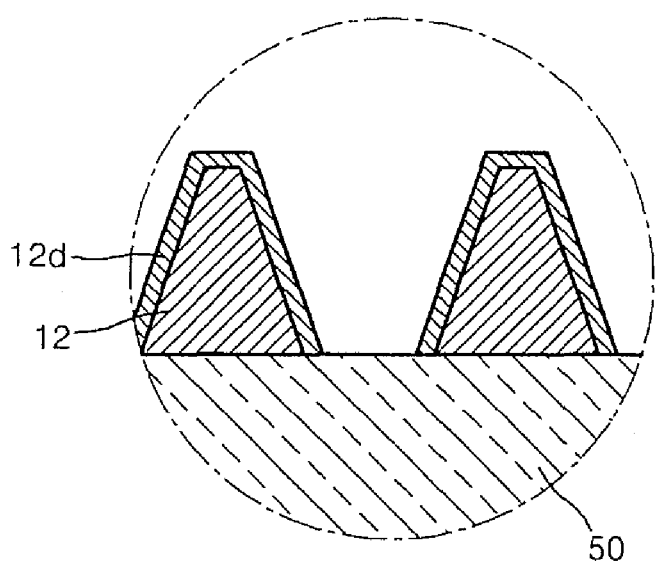

FIG. 13 is a cross-sectional view illustrating another example of a top emission type organic light emitting display apparatus according to another embodiment of the present invention. A linear polarizing layer 22 is formed on a surface of a sealing member 50 that faces outside, i.e., that faces the incoming external light, and a quarter-wave layer 21 is formed on another surface of the sealing member 50 that faces an organic light emitting device 30. An enlarged view of portion F of FIG. 13, that is, a more detailed structure of the linear polarizing layer 22, is shown in FIG. 14. A plurality of electrode units 12 are formed on an upper surface of the sealing member 50. In each of the electrode units 12, a surface that faces the sealing member 50 is formed to be wider than the opposite surface which faces the incoming external light. More detailed descriptions of the structure of the organic light emitting display apparatus and the effects of the structure are not provided below since the structure, except the locations of the quarter-wave layer 21 and the linear polarizing layer 22, and the effect of the structure are substantially identical to those described in a previous embodiment.

Figure 15:
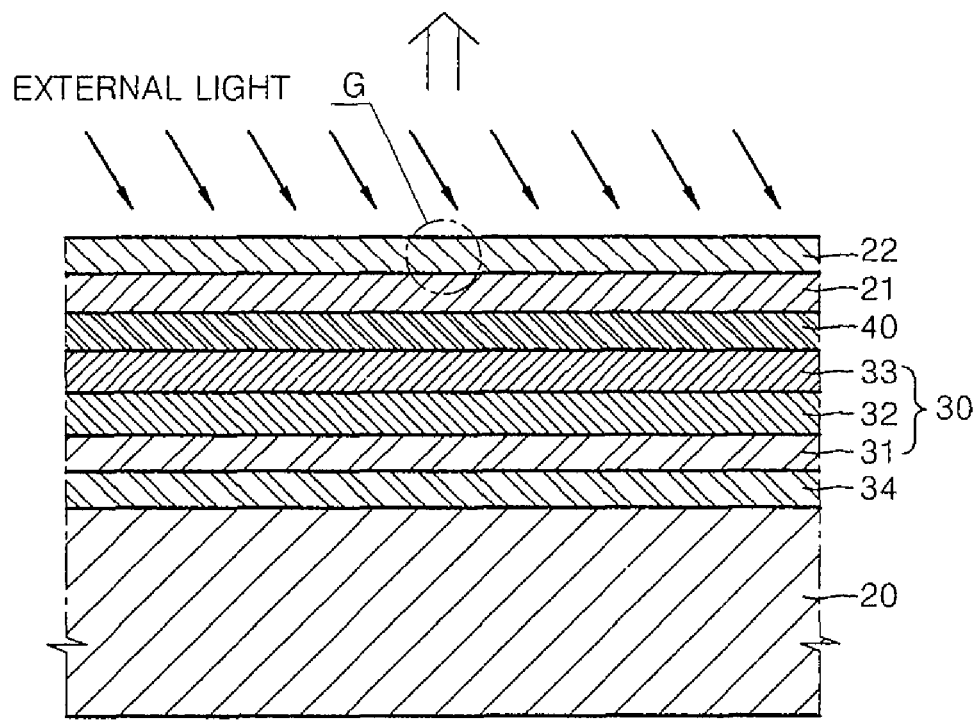
Figure 16:
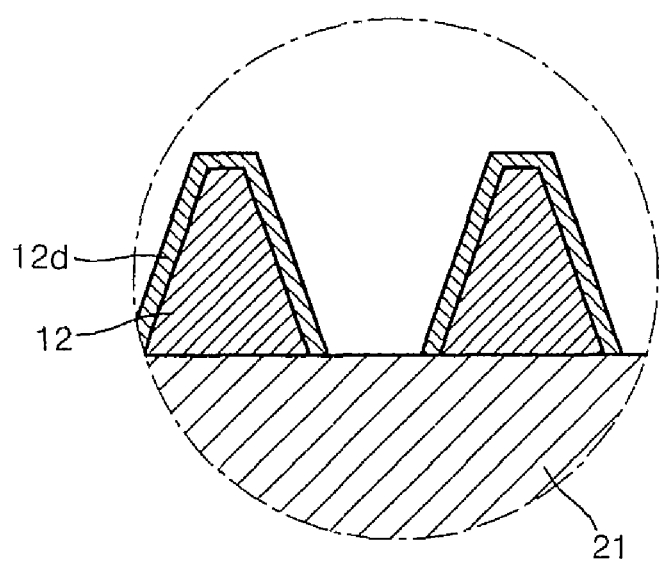

FIG. 15 is a schematic cross-sectional view illustrating another example of a top emission type organic light emitting display apparatus according to another embodiment of the present invention. A reflection film 34, an organic light emitting device 30, a quarter-wave layer 21, and a linear polarizing layer 22 are sequentially formed on a substrate 20. An enlarged view of portion G of FIG. 15, that is, a more detailed structure of the linear polarizing layer 22, is shown in FIG. 16. A plurality of electrode units 12 are formed on the quarter-wave layer 21. In each of the electrode units 12, a surface that faces the quarter-wave layer 21 is formed to be wider than the opposite surface which faces the incoming external light. In one embodiment, a passivation layer 40 can be formed between a second electrode layer 33 and the quarter-wave layer 21. The passivation layer 40 prevents the second electrode layer 33 from being damaged during a process of manufacturing the quarter-wave layer 21.

In one embodiment, the passivation layer 40 can be formed of an organic or inorganic material. The inorganic material can include a metal oxide, a metal nitride, a metal carbide, a metal oxynitride, or a compound of two or more of these materials. The metal oxide can include a silicon oxide, an aluminum oxide, a titanium oxide, an indium oxide, a tin oxide, an indium tin oxide, or a compound of two or more of these materials. The metal nitride can include an aluminum nitride, a silicon nitride, or a compound of these materials. The metal carbide can include a silicon carbide, and the metal oxynitride can be a silicon oxynitride. In addition, the inorganic material can include silicon or a derivative of silicon and one or more of the above-described metals, and can also include diamond-like carbon (DLC).

The organic material can include an organic polymer, an organometallic polymer, a hybrid organic/inorganic polymer, and/or an acryl resin. More detailed descriptions of the structure and effect of the structure are not provided below since the structure, except the locations of the quarter-wave layer 21 and the linear polarizing layer 22, and the effect of the structure are substantially identical to those of a previous embodiment.

Figure 17:
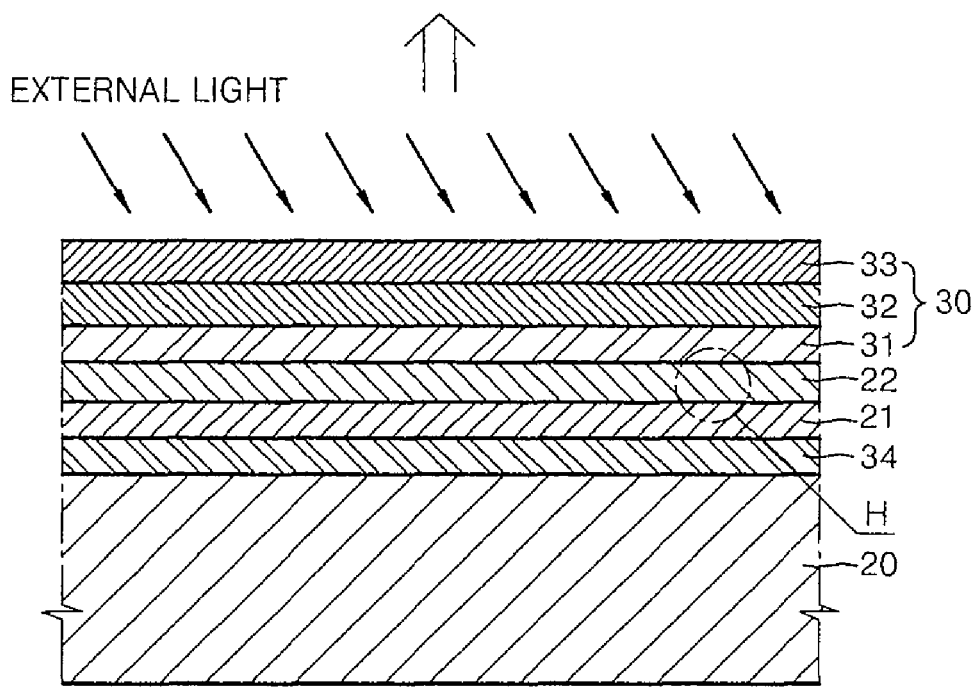
Figure 18:
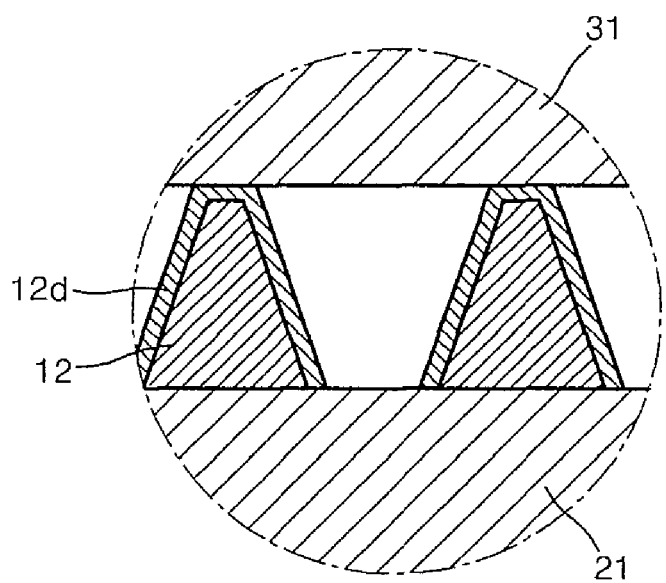

FIG. 17 is a cross-sectional view illustrating another example of a top emission type organic light emitting display apparatus according to another embodiment of the present invention. FIG. 17 shows an example of a structure having a quarter-wave layer 21 and a linear polarizing layer 22 formed between a reflection film 34 and an organic light emitting device 30. An enlarged view of portion H of FIG. 17, that is, a more detailed structure of the linear polarizing layer 22, is shown in FIG. 18. A plurality of electrode units 12 are formed on the quarter-wave layer 21. In each of the electrode units 12, a surface that faces a first electrode 31 on which external light may be incident has a width smaller than that of the opposite surface of the electrode unit 12 that faces the quarter-wave layer 21. Here, external light entering from above the organic light emitting layer 30 is polarized into a linearly polarized light having a polarization direction substantially parallel to a transmitting axis of the linear polarizing layer 22 as a result of passing through the linear polarizing layer 22, is transformed to a circularly polarized light rotating in a first direction as a result of passing through the quarter-wave layer 21, and is transformed to a circularly polarized light rotating in a second direction as a result of being reflected by the reflection film 34. The circularly polarized light rotating in the second direction is transformed to a linearly polarized light having a polarization direction substantially perpendicular to the transmitting axis of the linear polarization layer as a result of re-passing through the quarter-wave layer 21. As such, the linearly polarized light re-passed through the quarter-wave layer 21 cannot pass through the linear polarizing layer 22. Therefore, the reflected external light cannot be seen from the outside.

A surface of the electrode unit 12 that faces the incoming external light has a width smaller than that of the opposite surface of the electrode unit 12. Thus, the reflection of the external light by the electrode units 12 can be reduced (or minimized).

In one embodiment, an organic light emitting display apparatus can be formed such that a quarter-wave layer 21 can be formed on a reflection film 34, an organic light emitting device 30 can be formed on the quarter-wave layer 21, and a linear polarizing layer 22 can be formed on the organic light emitting device 30.

Figure 19:
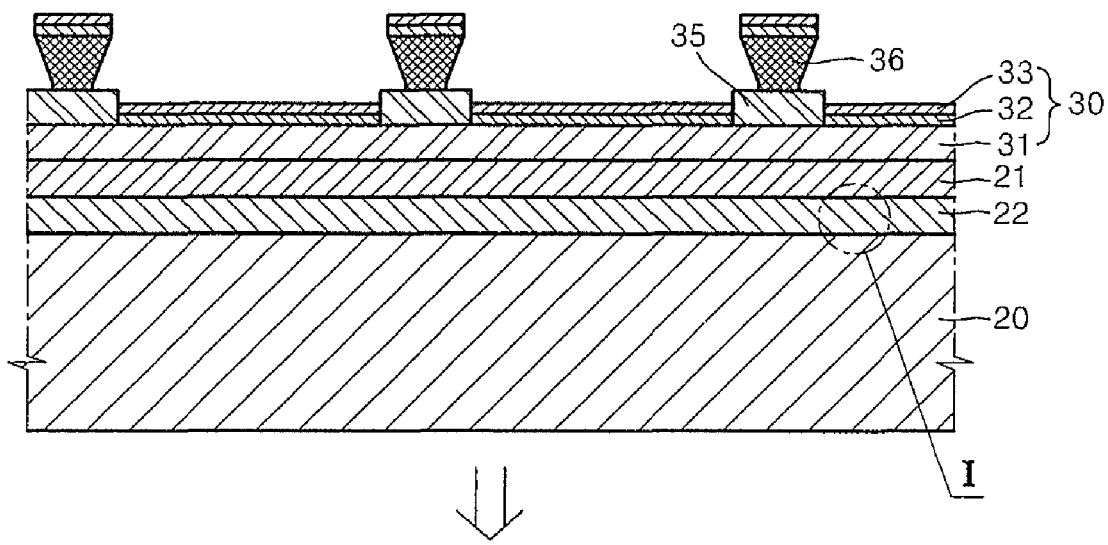
FIGS. 19 and 20 are schematic cross-sectional views illustrating a bottom emission passive matrix (PM) type organic light emitting display apparatus and an enlarged view of linear polarizing layers thereof, according to another embodiment of the present invention.

FIG. 19 is a schematic cross-sectional view illustrating an example of a bottom emission PM type organic light emitting display apparatus according to another embodiment of the present invention.

Figure 20:
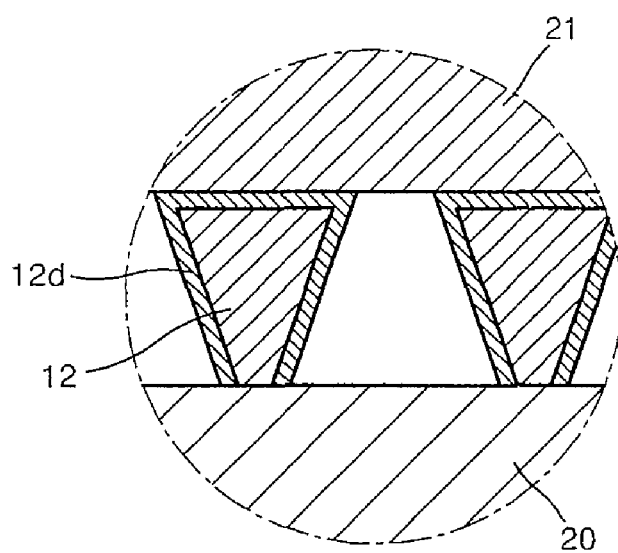

In the organic light emitting display apparatus of FIG. 19, a linear polarizing layer 22 and a quarter-wave layer 21 are sequentially formed on a substrate 20, and an organic light emitting device 30 is formed on the quarter-wave layer 21. An enlarged view of portion I of FIG. 19, that is, a more detailed structure of the linear polarizing layer 22, is shown in FIG. 20. A plurality of electrode units 12 are formed on the substrate 20. In each of the electrode units 12, a surface that faces the substrate 20, that is, the surface that faces the incoming external light has a width smaller than that of the opposite surface that faces the quarter-wave layer 21.

As shown in FIG. 19, a first electrode 31 having a stripe shape (which may be predetermined) is formed on the quarter-wave layer 21, and an inner insulating layer 35 is formed on the first electrode 31. Separators 36 for patterning an organic light emitting layer 32 and a second electrode 33 are formed in a vertical (or height) direction on the first electrode 31. The organic light emitting layer 32 and the second electrode 33 are patterned to cross the first electrode 31 at regions between the separators 36. In one embodiment, a sealing member is formed on the second electrode 33 to seal the organic light emitting device 30 from exposure to external air. In one embodiment, the organic light emitting layer 32 and the second electrode 33 can be patterned without use of the separators 36.

As depicted in the embodiment shown in FIG. 19, as in previously described embodiments, since the linear polarizing layer 22 and the quarter-wave layer 21 are sequentially formed on the substrate 20, the linear polarizing layer 22 and the quarter-wave layer 21 can reduce (or prevent) the reflection of external light that enters from a bottom side of the substrate 20, and can reduce the overall thickness of the organic light emitting display apparatus.

In one embodiment, a surface of the electrode unit 12 that faces the incoming external light has a width smaller than that of the opposite surface of the electrode unit 12, thereby reducing (or minimizing) the reflection of external light.

In other embodiments, the respective structures shown in FIGS. 5 and 7 can similarly be applied in a PM type organic light emitting display apparatus.

Figure 21:
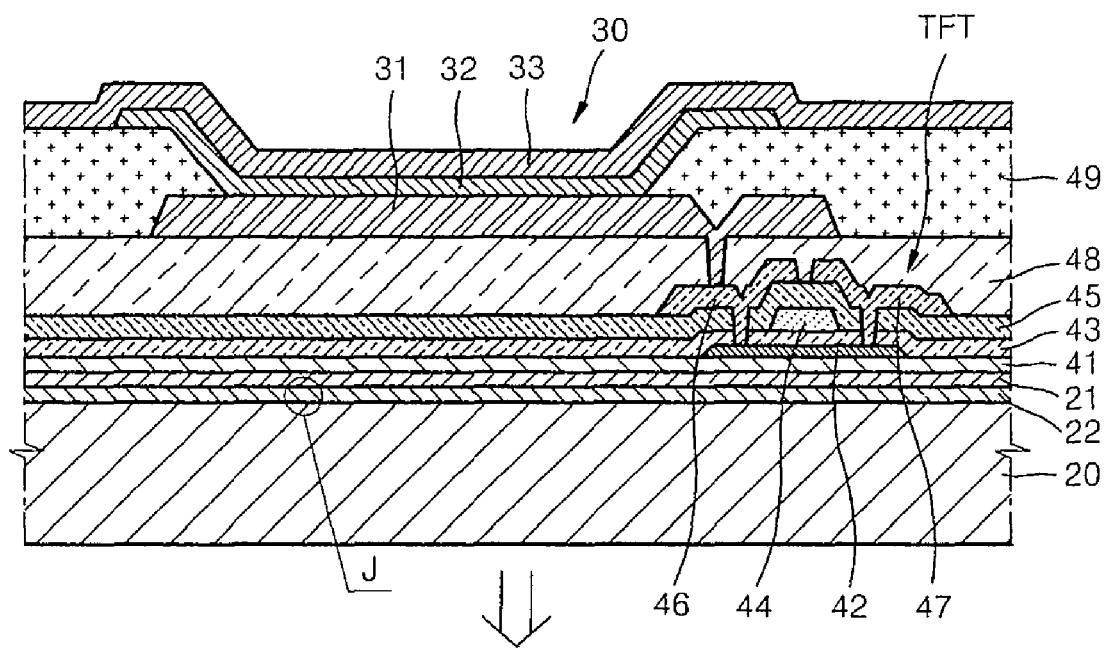
FIGS. 21 and 22 are schematic cross-sectional views illustrating a bottom emission active matrix (AM) type organic light emitting display apparatus and an enlarged view of linear polarizing layers thereof, according to another embodiment of the present invention.

FIG. 21 is a schematic cross-sectional view illustrating an example of a bottom emission AM type organic light emitting display apparatus according to an embodiment of the present invention.

Referring to FIG. 21, a thin film transistor (TFT) is formed on an upper surface of a substrate 20. At least one TFT is formed in (or at) each pixel of the bottom emission AM type organic light emitting display apparatus, and the TFT is electrically connected to an organic light emitting device 30.

Figure 22:
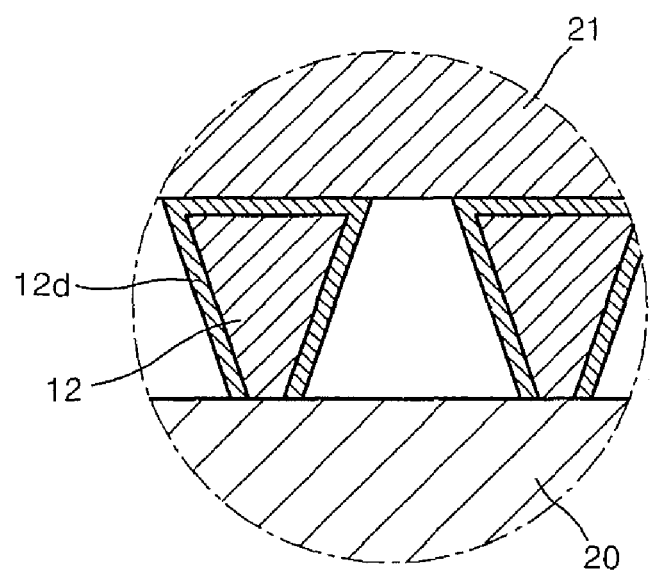

In more detail, a linear polarizing layer 22 and a quarter-wave layer 21 are sequentially formed on the substrate 20. An enlarged view of portion J of FIG. 21, that is, a more detailed structure of the linear polarizing layer 22 is shown in FIG. 22. A plurality of electrode units 12 are formed on the substrate 20. In each of the electrode units 12, a surface that faces the substrate 20, that is, the surface that faces the incoming external light, has a width smaller than that of the opposite surface of the electrode unit 12 that faces the quarter-wave layer 21.

A buffer layer 41 is formed on the quarter-wave layer 21, and a semiconductor layer 42 having a pattern (which may be a predetermined pattern) is formed on the buffer layer 41. A gate insulating film 43 formed of SiO2, SiNx or the like is formed on the semiconductor layer 42, and a gate electrode 44 is formed on an upper region (which may be a predetermined region) of the gate insulating film 43. A gate electrode 44 is connected to a gate line that applies an On/Off signal to the TFT. An interlayer insulating layer 45 is formed on the gate electrode 44, and a source electrode 46 and a drain electrode 47 are respectively connected to a source region and a drain region of the semiconductor layer 42 through contact holes. In one embodiment, the TFT formed in the above manner is protected (or covered) by a passivation film 48.

A first electrode 31 that acts as an anode electrode is formed on the passivation film 48 and a pixel define layer 49 covering the first electrode 31 is formed of an insulating material. After an opening (which may be of predetermined dimensions) and/or location is formed in the pixel define layer 49, an organic light emitting layer 32 is formed in a region defined by the opening and/or location. A second electrode 33 is formed to cover the entire pixel (or entire pixels).

In an AM type structure, the linear polarizing layer 22 and the quarter-wave layer 21 are sequentially formed on the substrate 20, and the linear polarizing layer 22, and the quarter-wave layer 21 can reduce (or prevent) the reflection of external light entering from a bottom side of the substrate 20 of FIG. 21.

Also, in each of the electrode units 12, a surface that faces the incoming external light has a width smaller than that of the opposite surface of the electrode unit 12. Thus, an area of the electrode units 12 for reflecting the external light is reduced. As a result, the reflection of the external light is reduced, thereby increasing contrast of the AM type organic light emitting display apparatus. In one embodiment, the reflection of the external light can further be reduced if the electrode units 12 are blackened.

In the bottom emission AM type organic light emitting display apparatus, in one embodiment, the linear polarizing layer 22 and the quarter-wave layer 21 can be formed on any suitable surfaces of the substrate 20, the TFT, and the organic light emitting device 30 as long as the linear polarizing layer 22 is disposed to face the incoming external light and the quarter-wave layer 21 is disposed to face the organic light emitting device 30. That is, as depicted in FIGS. 5 and 7, after the quarter-wave layer 21 and the linear polarizing layer 22 are formed on a surface (or opposite surfaces) of a substrate 20, a TFT and an organic light emitting device 30 can be formed on the linear polarizing layer 22 and/or the quarter-wave layer 21 (or the quarter-wave layer 21 and/or the linear polarizing layer 22 can be disposed between boundary surfaces formed by layers of a TFT).

In one embodiment, instead of forming the passivation film 48 on the TFT using an organic or inorganic material, the linear polarizing layer 22 and the quarter-wave layer 21 can be sequentially formed on the interlayer insulating layer 45 to act as the passivation film 48.

Figure 23:
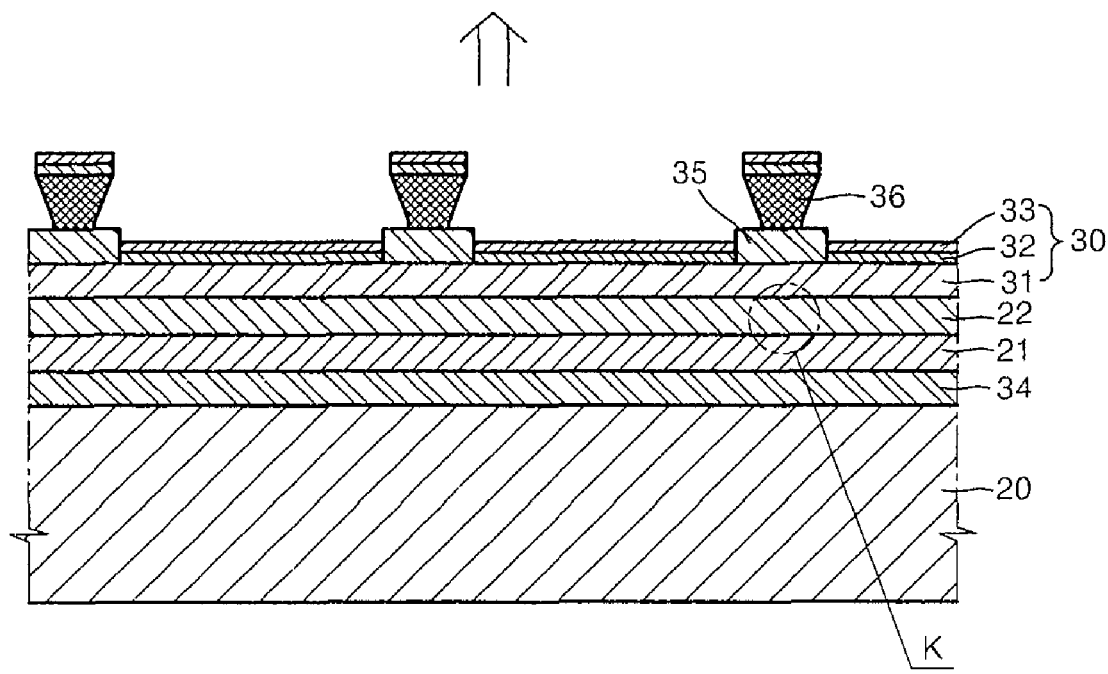
FIGS. 23 and 24 are schematic cross-sectional views illustrating a top emission PM type organic light emitting display apparatus and an enlarged view of linear polarizing layers thereof, according to another embodiment of the present invention.

FIG. 23 is a schematic cross-sectional view illustrating a top emission PM type organic light emitting display apparatus according to another embodiment of the present invention.

A reflection film 34 is formed on a substrate 20, a quarter-wave layer 21 and a linear polarizing layer 22 are sequentially formed on the reflection film 34, and an organic light emitting device 30 is formed on the linear polarizing layer 22.

Figure 24:
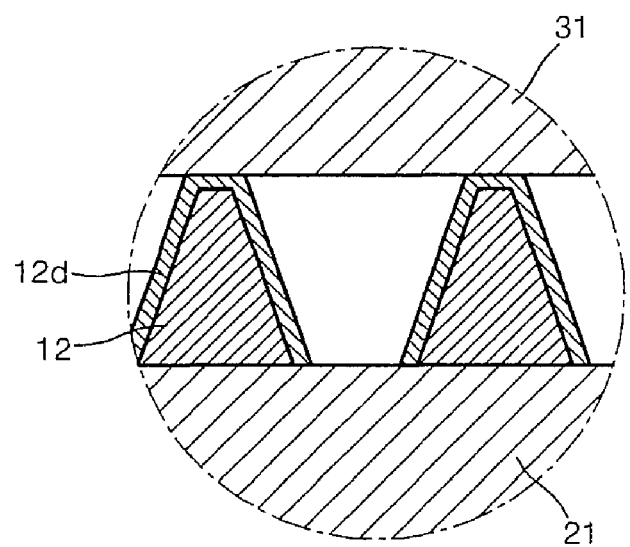

An enlarged view of portion K of FIG. 23, that is, a more detailed structure of the linear polarizing layer 22, is shown in FIG. 24. A plurality of electrode units 12 are formed on the quarter-wave layer 21. In each of the electrode units 12, a surface that faces the incoming external light, that is, the surface that faces a first electrode 31 has a width smaller than that of the opposite surface of the electrode unit 12 that faces the quarter-wave layer 21.

The first electrode 31 is formed in a stripe pattern (which may be a predetermined stripe pattern) on the linear polarizing layer 22. An inner insulating layer 35 is formed on the first electrode 31. Separators 36 crossing the first electrode 31 are formed on the inner insulating layer 35 for patterning an organic light emitting layer 32 and a second electrode 33. The organic light emitting layer 32 and the second electrode 33 are patterned to cross the first electrode 31 at regions between the separators 36. In one embodiment, a sealing member is formed on the second electrode 33 to protect the organic light emitting device 30 from exposure to external air. In one embodiment, the organic light emitting layer 32 and the second electrode 33 can be patterned without use of the separators 36.

In the embodiment shown in FIG. 23, external light entering from the outside is not reflected, thereby increasing contrast of the PM type organic light emitting display apparatus, and an overall thickness of the organic light emitting display apparatus can be reduced.

Also, in each of the electrode units 12, a surface that faces the incoming external light enters has a width smaller than that of the opposite surface of the electrode unit 12. Thus, the reflection of external light by the electrode units 12 is reduced (or minimized), thereby increasing contrast.

In embodiments of the present invention, the respective structures shown in FIGS. 9, 11, 13, 15, and 17 can be similarly applied to a top emission PM type organic light emitting display apparatus.

Figure 25:
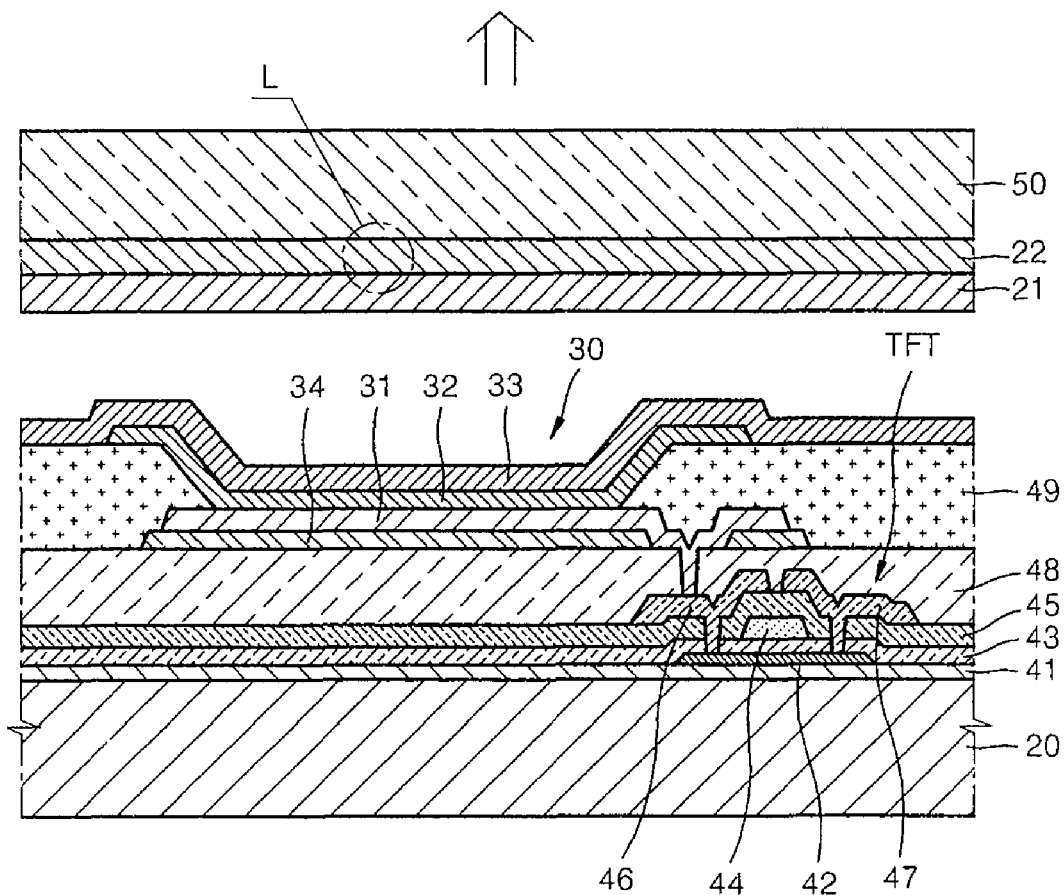
FIGS. 25 and 26 are schematic cross-sectional views illustrating a top emission AM type organic light emitting display apparatus and an enlarged view of linear polarizing layers thereof, according to another embodiment of the present invention.

FIG. 25 is a cross-sectional view illustrating a bottom emission AM type organic light emitting display apparatus according to another embodiment of the present invention.

Referring to FIG. 25, a TFT is formed on a top surface of a substrate 20. At least one TFT is formed in (or at) each pixel of the organic light emitting display apparatus, and the TFT is electrically connected to an organic light emitting device 30. The structure of the TFT is substantially identical to the structure of that shown in FIG. 21, and, thus, a more detailed description thereof will not be provided below.

A passivation film 48 for covering the TFT is formed on the TFT. A reflection film 34 is formed on the passivation film 48. A first electrode 31 that acts as an anode electrode is formed on the reflection film 34, and a pixel define layer 49 for covering the first electrode 31 is formed of an insulating material. After forming a opening (which may be of predetermined dimensions) and/or location in the pixel define layer 49, an organic light emitting layer 32 is formed in a region defined by the opening and/or location. A second electrode 33 is formed to cover the entire pixel (or entire pixels).

Figure 26:
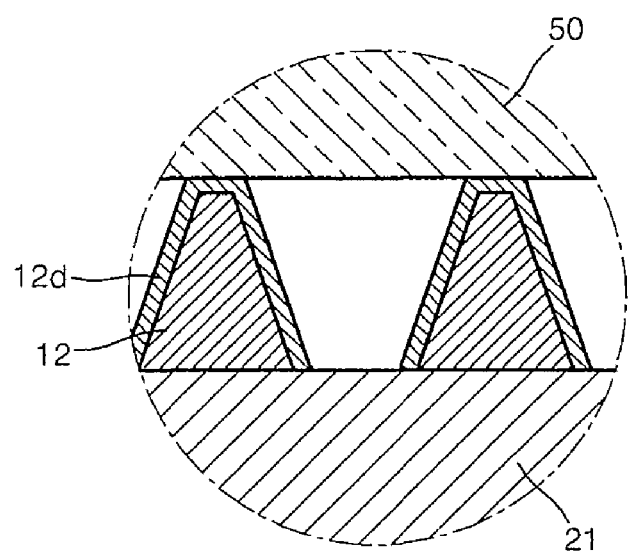

As depicted in FIG. 25, in the present embodiment, a linear polarizing layer 22 and a quarter-wave layer 21 are sequentially formed on a surface of a sealing member 50 that faces the organic light emitting device 30. An enlarged view of portion L of FIG. 25, that is, a more detailed structure of the linear polarizing layer 22, is shown in FIG. 26. A plurality of electrode units 12 are formed on the quarter-wave layer 21. In each of the electrode units 12, a surface that faces the incoming external light, that is, the surface facing the sealing member 50, has a width smaller than that of the opposite surface of the electrode unit 12 that faces the quarter-wave layer 21.

The linear polarizing layer 22 and the quarter-wave layer 21 can reduce (or prevent) the reflection of external light that enters from above the sealing member 50 in FIG. 25.

In one embodiment, in each of the electrode units 12, a surface that faces the incoming external light has a width smaller than that of the opposite surface of the electrode unit 12. As a result, the reflection of external light is reduced, thereby increasing contrast of the AM type organic light emitting display apparatus.

In other embodiments, the respective structures shown in FIGS. 9, 11, 13, 15, and 17 can similarly be applied to a top emission AM type organic light emitting display apparatus.

Embodiments of the present invention are not limited to an organic light emitting display apparatus, but can also be applied to various flat panel display apparatuses that use an inorganic light emitting device, a liquid crystal display (LCD) device, or an electron emission device as a light emitting device.

A polarizer according to embodiments of the present invention and a light emitting display apparatus having the polarizer can be used to increase contrast and visibility of the light emitting display apparatus.

While the present invention has been shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. An organic light emitting display apparatus comprising:
a substrate;
an organic light emitting device formed on the substrate and adapted to display an image;
a sealing member formed on the organic light emitting device;
a quarter-wave layer formed on one of the substrate, the organic light emitting device, or the sealing member; and
a linear polarizing layer formed on one of the substrate, the organic light emitting device, the sealing member, or the quarter-wave layer,
wherein a distance between the linear polarizing layer and a location at which the image is displayed is smaller than a distance between the quarter-wave layer and the location at which the image is displayed, and
wherein the linear polarizing layer comprises a plurality of electrode units, each of the electrode units having a first surface facing incoming external light and a second surface opposite the first surface, the first surface having a width smaller than a width of the second surface.

2. The organic light emitting display apparatus of claim 1, wherein the image is displayed towards the substrate, the quarter-wave layer is formed on the linear polarizing layer, and the organic light emitting device is formed on the quarter-wave layer.

3. The organic light emitting display apparatus of claim 1, wherein the image is displayed towards the substrate, the quarter-wave layer is formed on the linear polarizing layer, the linear polarizing layer is formed on the substrate, and the organic light emitting device is formed on the quarter-wave layer.

4. The organic light emitting display apparatus of claim 1, wherein the image is displayed towards the substrate, the quarter-wave layer is formed on a first surface of the substrate, the organic light emitting device is formed on the quarter-wave layer, and the linear polarizing layer is formed on a second surface of the substrate, the second surface of the substrate being opposite the first surface of the substrate.

5. The organic light emitting display apparatus of claim 1, wherein the image is displayed towards the substrate, the organic light emitting device is formed at a first surface of the substrate, and the quarter-wave layer and the linear polarizing layer are sequentially formed on a second surface of the substrate, the second surface of the substrate being opposite the first surface of the substrate.

6. The organic light emitting display apparatus of claim 1, wherein the image is displayed towards the sealing member, the quarter-wave layer is formed on the organic light emitting device, and the linear polarizing layer is formed on the quarter-wave layer.

7. The organic light emitting display apparatus of claim 6, further comprising a passivation film formed between the organic light emitting device and the quarter-wave layer.

8. The organic light emitting display apparatus of claim 1, wherein the image is displayed towards the sealing member, the quarter-wave layer and the linear polarizing layer are sequentially formed on a surface of the sealing member opposite a surface of the sealing member on which the organic light emitting device is formed.

9. The organic light emitting display apparatus of claim 1, wherein the image is displayed towards the sealing member, the quarter-wave layer is formed on a surface of the sealing member facing the organic light emitting device, and the linear polarizing layer is formed on a surface of the sealing member opposite a surface of the sealing member on which the quarter-wave layer is formed.

10. The organic light emitting display apparatus of claim 1, wherein the image is displayed towards the sealing member, the linear polarizing layer is formed on a surface of the sealing member facing the organic light emitting device, and the quarter-wave layer is formed on a surface of the linear polarizing layer facing the organic light emitting device.

11. The organic light emitting display apparatus of claim 1, further comprising a reflection film interposed between the substrate and the organic light emitting device, wherein the image is displayed towards the sealing member, the quarter-wave layer is formed between the reflection film and the organic light emitting device, and the linear polarizing layer is formed on the organic light emitting device.

12. The organic light emitting display apparatus of claim 1, wherein the electrode units comprise at least one of aluminum, silver, or chromium.

13. The organic light emitting display apparatus of claim 1, further comprising a blackened layer on surfaces of each of the electrode units for absorbing external light.

* * * * *